(12) United States Patent
Pfaffinger et al.

(10) Patent No.: US 12,229,486 B2
(45) Date of Patent: Feb. 18, 2025

(54) METHOD FOR DETERMINING SET-UP FAMILIES FOR A PICK-AND-PLACE LINE FOR POPULATING CIRCUIT BOARDS WITH ELECTRONIC COMPONENTS

(71) Applicant: Siemens Aktiengesellschaft, Munich (DE)

(72) Inventors: Alexander Pfaffinger, Munich (DE); Christian Royer, Ottobrunn (DE)

(73) Assignee: Siemens Aktiengesellschaft, Munich (DE)

( * ) Notice: Subject to any disclaimer, the term of this patent is extended or adjusted under 35 U.S.C. 154(b) by 603 days.

(21) Appl. No.: 17/440,307

(22) PCT Filed: Mar. 25, 2019

(86) PCT No.: PCT/EP2019/057383
§ 371 (c)(1),
(2) Date: Sep. 17, 2021

(87) PCT Pub. No.: WO2020/192881
PCT Pub. Date: Oct. 1, 2020

(65) Prior Publication Data
US 2022/0147685 A1 May 12, 2022

(51) Int. Cl.
*G06F 30/392* (2020.01)
*G06F 30/398* (2020.01)
*H05K 13/08* (2006.01)

(52) U.S. Cl.
CPC .......... *G06F 30/392* (2020.01); *G06F 30/398* (2020.01); *H05K 13/0857* (2018.08)

(58) Field of Classification Search
CPC . G06F 30/392; G06F 30/398; H05K 13/0857; H05K 13/085; Y02P 90/02; Y02P 90/30; G06Q 10/04; G06Q 50/04
See application file for complete search history.

(56) References Cited

U.S. PATENT DOCUMENTS

| 2015/0135505 A1* | 5/2015 | Royer | H05K 13/085 |
|---|---|---|---|
| | | | 29/428 |
| 2015/0160648 A1* | 6/2015 | Craiovan | G05B 19/418 |
| | | | 700/121 |

(Continued)

FOREIGN PATENT DOCUMENTS

| CN | 103150265 A | 6/2013 |
|---|---|---|
| CN | 104412729 A | 3/2015 |

(Continued)

OTHER PUBLICATIONS

International Search Report For PCT/EP2019/057383 issued Dec. 3, 2019.

*Primary Examiner* — Nha T Nguyen
(74) *Attorney, Agent, or Firm* — Schmeiser, Olsen & Watts LLP

(57) ABSTRACT

Provided is a method for determining set-up families for a pick-and-place line for populating circuit boards with electronic components one or more component types, the method including the following steps: detecting a predetermined or predeterminable number of set-up families; wherein a set-up family is defined as a quantity of circuit boards that can be populated on a pick-and-place line without changing the quantity of component types kept ready for population on the pick-and-place line; wherein an assignment of circuit boards to be distributed to the detected number of set-up families is optimized by integer linear programming in such a way that the sum of the numbers of component types per set-up family is minimized; and populating the circuit boards in the set-up family assigned to them.

11 Claims, 2 Drawing Sheets

(56) References Cited

U.S. PATENT DOCUMENTS

| | | | |
|---|---|---|---|
| 2015/0195965 A1* | 7/2015 | Craiovan | H05K 3/303 |
| | | | 29/739 |
| 2015/0195966 A1* | 7/2015 | Pfaffinger | H05K 13/085 |
| | | | 700/121 |
| 2015/0296671 A1* | 10/2015 | Pfaffinger | H05K 13/0857 |
| | | | 29/745 |
| 2017/0311491 A1* | 10/2017 | Pfaffinger | H05K 13/085 |
| 2017/0374745 A1* | 12/2017 | Pfaffinger | H05K 13/0857 |
| 2018/0299871 A1 | 10/2018 | Pfaffinger et al. | |

FOREIGN PATENT DOCUMENTS

| | | |
|---|---|---|
| CN | 107438803 A | 12/2017 |
| DE | 102015206741 A1 | 10/2016 |
| EP | 2829165 A1 | 1/2015 |
| EP | 2829166 A1 | 1/2015 |
| EP | 2829166 B1 | 7/2018 |
| WO | WO 2014/005741 A1 | 1/2014 |
| WO | WO 2014005742 A1 | 1/2014 |

\* cited by examiner

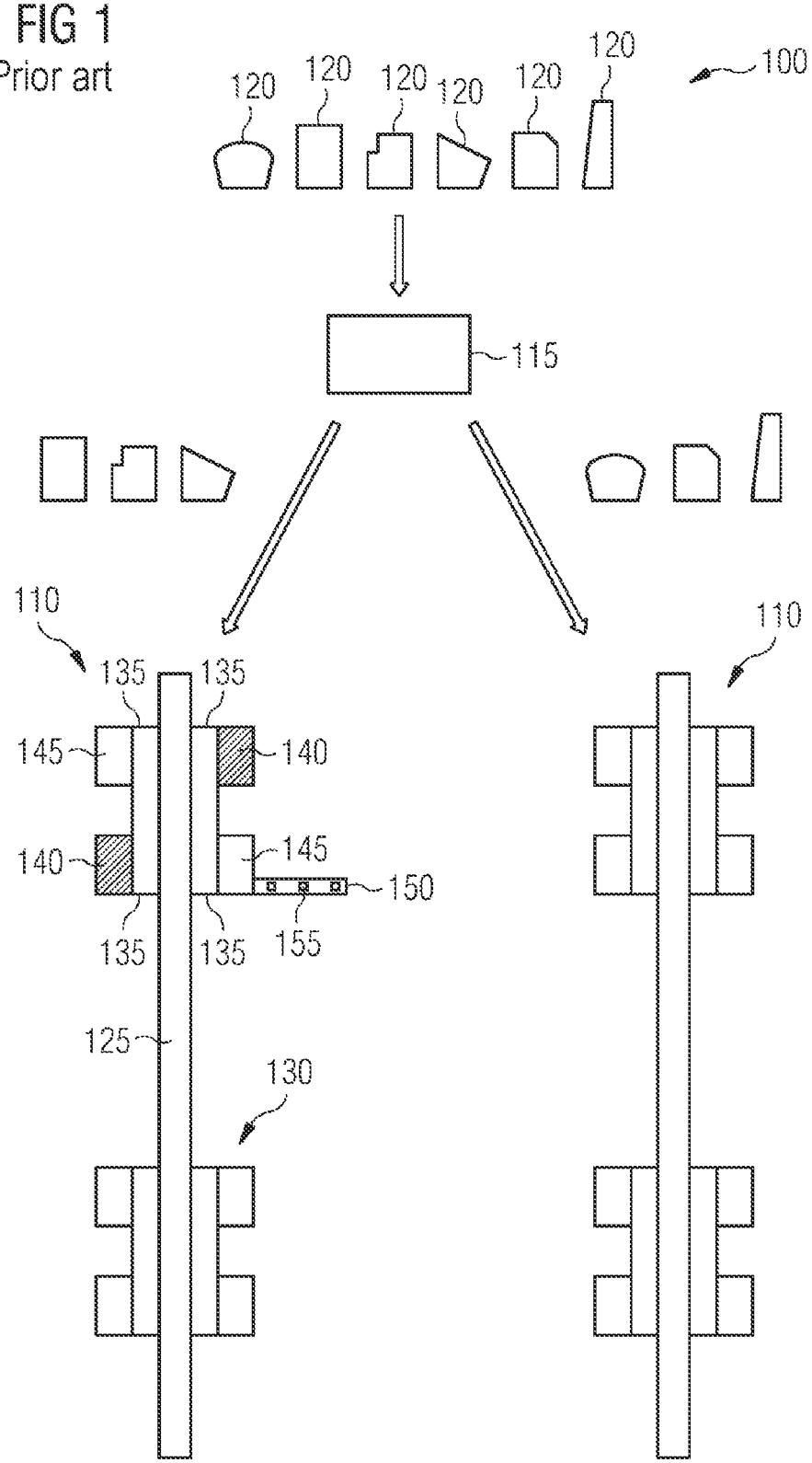

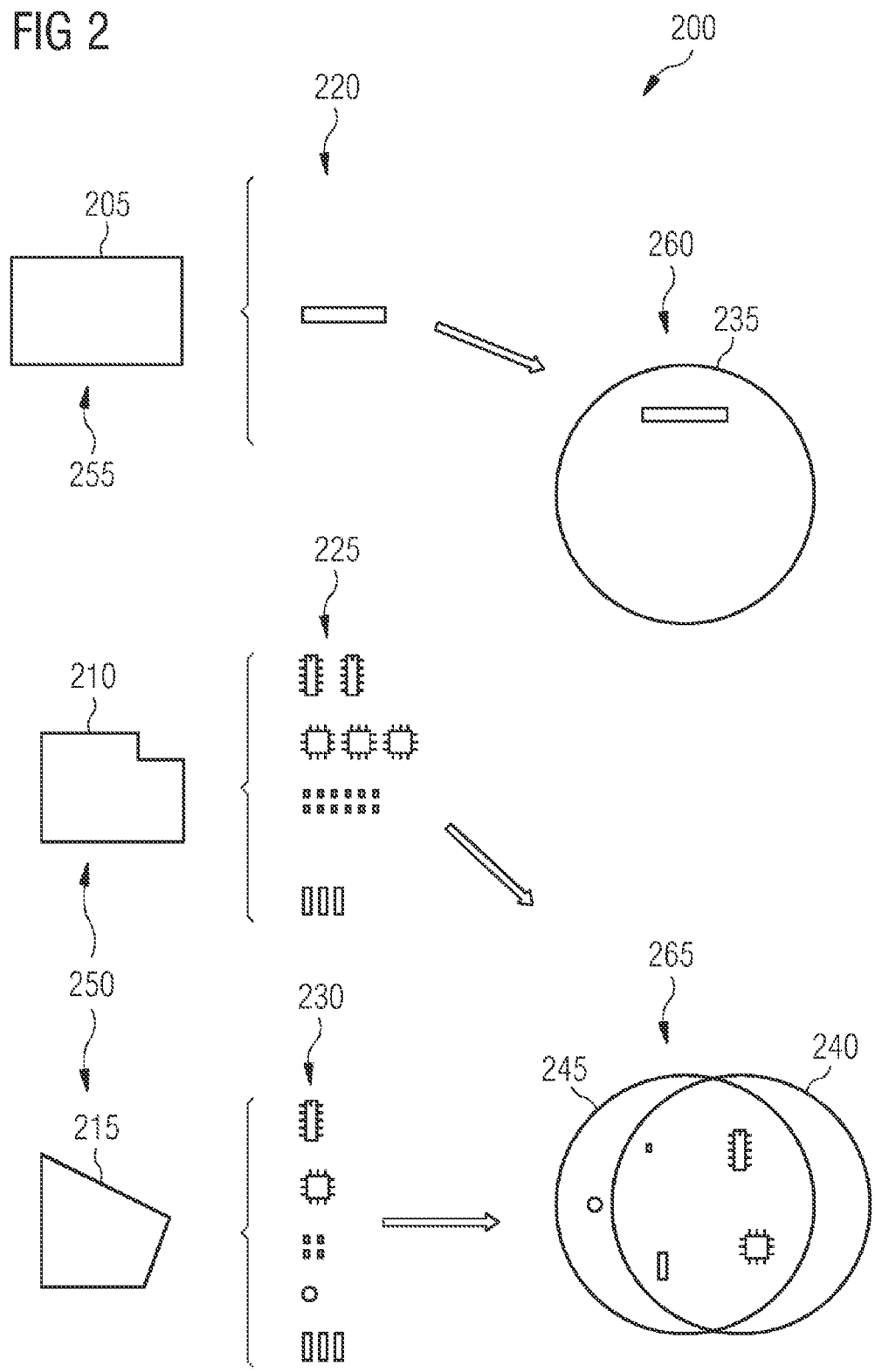

METHOD FOR DETERMINING SET-UP FAMILIES FOR A PICK-AND-PLACE LINE FOR POPULATING CIRCUIT BOARDS WITH ELECTRONIC COMPONENTS

CROSS-REFERENCE TO RELATED APPLICATIONS

This application claims priority to PCT Application No. PCT/EP2019/057383, having a filing date of Mar. 25, 2019, the entire contents of which are hereby incorporated by reference.

FIELD OF TECHNOLOGY

The following relates to a method for determining set-up families for a pick-and-place line for populating circuit boards with electronic components or components. The following further relates to a control device for a production or assembly line for populating circuit boards with components. The following further relates to a computer program product and a computer-readable medium.

BACKGROUND

Particularly in the field of electronics production, circuit boards or assemblies to be manufactured are produced on SMT pick-and-place lines by surface-mounted technology (SMT).

A set-up family is defined as a quantity of circuit boards or assemblies that can be populated on a pick-and-place line without changing the quantity of component types kept ready for population on the pick-and-place line. Existing tools for determining set-up families often either require manual effort or do not always deliver convincing results. Other known tools are tied to a particular pick-and-place system for use.

SUMMARY

An aspect relates to an improved technique for assigning or distributing circuit boards to a predetermined or predeterminable number of set-up families with a minimum number of component types to be set up.

A minimum number of component types to be set up on shuttle tables saves time and economic costs, wherein the shuttle tables hold the components ready on a line for the manufacture of the circuit boards. The quantity of component types held ready on the pick-and-place line is also referred to as the set-up. It is usually assumed that a sufficient number of components of each component type are always kept ready on the pick-and-place line.

Embodiments of the invention claim a method for determining set-up families for a pick-and-place line for populating circuit boards with electronic components of one or more component types, wherein the method comprises the following steps:
  detecting a predetermined or predeterminable number of set-up families;
  wherein a set-up family is defined as a quantity of circuit boards that can be populated on a pick-and-place line without changing the quantity of component types kept ready for population on the pick-and-place line;
characterized in that
  an assignment of circuit boards to be distributed to the detected number of set-up families is optimized by integer linear programming in such a way that the sum of the numbers of component types per set-up family is minimized.

With the assignment obtained, the circuit boards can be populated in the set-up family assigned to them.

This means that fewer set-up stations are required, since a redundant set-up of components of the same component type is avoided on the whole.

The detected number of set-up families can represent a minimum number of set-up families.

One development of embodiments of the invention provides that a maximum threshold value in the form of a maximum degree of filling is predetermined for the quantity of component types that are kept ready for the population on the pick-and-place line.

One development of embodiments of the invention provides that the assignment of circuit boards to be distributed to the detected number of set-up families also takes place in such a way that the circuit boards of a sub-quantity of the circuit boards to be distributed are assigned to the same set-up family.

One development of embodiments of the invention provides that the assignment of circuit boards to be distributed to the detected number of set-up families also takes place in such a way that the circuit boards of a sub-quantity of the circuit boards to be distributed are each assigned to a different set-up family.

The method can be used for small and medium-sized problems such as achieving very good results for the fixed set-up lines in a relatively short time. In addition, the process is very flexible, i.e., additional restrictions and other low-weighted objective function components can easily be incorporated. By reducing the number of fixed set-ups, time savings and economic savings are made. The method can be used with all conventional pick-and-place lines.

A further aspect of embodiments of the invention provides a control device which is designed, in particular, to carry out the method of the aforementioned type and its embodiments. The control device can be a computer associated with the pick-and-place system and possibly remotely arranged or a control module integrated into the pick-and-place system.

The control device for determining set-up families for a pick-and-place line for populating circuit boards with electronic components of one or more component types has:
  means for detecting or a detector for a determined or predeterminable number of set-up families,
  wherein a set-up family is defined as a quantity of circuit boards that can be populated on a pick-and-place line without changing the quantity of component types that are kept ready for population on the pick-and-place line;
characterized by
  means for assigning or an assignor for circuit boards to be distributed to the detected number of set-up families which are designed to optimize this assignment by integer linear programming in such a way that the sum of the number of component types per set-up family is minimized, and
  means for carrying out the population or a populator of the circuit boards in the set-up family assigned to them.

A further aspect of embodiments of the invention is a computer program (product) with program code means or program code for carrying out the method as claimed in one of the preceding method claims when it runs on a control device of the above-mentioned type or is stored on a computer-readable medium.

The computer program or a computer program product (non-transitory computer readable storage medium having instructions, which when executed by a processor, perform actions) can be stored on a computer-readable medium. The computer program or computer program product can be created in a conventional programming language (e.g., C++, Java). The processing device can comprise a commercially available computer or server with corresponding input, output and storage means or input, output and storage. This processing device can be integrated into the control device or into the the control device.

The control device as well as the computer program (product) can be developed or designed in line with the above-mentioned method.

BRIEF DESCRIPTION

Some of the embodiments will be described in detail, with references to the following Figures, wherein like designations denote like members, wherein:

FIG. 1 shows a pick-and-place system; and

FIG. 2 shows an illustration of the formation of set-up families on the pick-and-place system from FIG. 1 according to embodiments of the invention.

DETAILED DESCRIPTION

One possible optimization method for optimizing the allocation of the circuit boards to be distributed is linear optimization. It is concerned with optimizing linear objective functions over a quantity constrained by linear equations and inequalities. It forms the basis of the solution method for (mixed) integer linear optimization. A solver is a collective name for special mathematical computer programs that can solve mathematical problems numerically. In connection with MILP (mixed integer linear programming), standard solvers such as e.g., CPLEX, Scip, Gurobi, Xpress can be used for IP programs (integer optimization models).

FIG. 1 shows a pick-and-place system 100. The pick-and-place system 100 comprises a plurality of pick-and-place lines 110 and a control device 115 for assigning circuit boards 120 to the pick-and-place lines 110. Each pick-and-place line 110 usually comprises a transport system 125 and one or more automatic pick-and-place machines 130. Each automatic pick-and-place machine 130 comprises one or more pick-and-place heads 135 which are configured in each case to pick up components from a constant table 140 or a variable table 145 and to position them at a predetermined position on the circuit board 120 located on the transport system 125. During the population process, the circuit board 120 is normally stationary in relation to the automatic pick-and-place machine 130. The tables 140, 145 each comprise a plurality of feed devices 150, only one of which is shown by way of example. Each feed device 150 holds a supply of components 155 of a predetermined type. Although each feed device 150 can be configured to hold different components or components 155 ready and different feed devices 150 can be attached to a table 140, 145, the tables 140, 145 are usually completely exchanged for speed reasons when an automatic pick-and-place machine 130 must be supplied with components 155 that are not held on one of the attached tables 140, 145.

Since such an exchange is usually associated with a production shutdown, the aim is to minimize the number of tables 140, 145 to be exchanged. If a table is not exchanged during a retooling process, it is referred to as a constant table 140, otherwise as a variable table 145. Otherwise, there are no functional differences between a constant table 140 and a variable table 145.

The circuit board 120 is to be populated with a number of different components 155. In order to minimize frequent exchanging of variable tables 145 and ideally to maximize a number of constant tables 140, the control device 115 is configured to optimize the assignment of a circuit board 120 to one of the pick-and-place lines 110. Specific properties of each pick-and-place line 110 or each automatic pick-and-place machine 130 must normally be taken into account in the same way as the properties of the circuit boards 120 or the components 155 to be populated on them.

FIG. 2 shows an illustration 200 of set-up families, also referred to as clusters. A first circuit board 205, a second circuit board 210 and a third circuit 215 are considered which correspond in each case to one of the circuit boards 120 in the pick-and-place system 100 from FIG. 1. A first quantity 220 of components 155 is to be fitted on the first circuit board 205, a second quantity 225 of components 155 on the second circuit board 210 and a third quantity 230 of components 155 on the third circuit board 215. As an example, the quantities 220, 225 and 230 each comprise different component types which are characterized by different shapes and of which components 155 are used in different numbers. Quantities 235 to 245 of component types are therefore assigned to the quantities 220 to 230 of components 155. Each of the different components 155 of the corresponding set 220 to 230 is found only once in the quantities 235 to 245.

A set-up family comprises those circuit boards 120 that are assigned to be populated on a pick-and-place line 100. In the example shown in FIG. 2, the circuit boards 210 and 215 are assigned to the same pick-and-place line 110 and form a first set-up family 250. The first set-up family 250 therefore requires a first set-up 265 with component types that are assigned to the circuit boards 210 and 215. In the example shown, the first set-up 265 comprises five component types. Providing the component type of the first set-up 265, the circuit boards 210 and 215 of the first set-up family 250 can be populated on the pick-and-place line 110 without retooling, wherein it is assumed that a maximum of five different component types can be accommodated in one set-up.

The third circuit board 205 alone forms a second set-up family 255. A second set-up 260 assigned to the second set-up family 255 comprises one component type.

The sum of the component types in the two set-ups is minimal.

The method according to embodiments of the invention uses the degrees of freedom in the individual distribution of the circuit boards to the one recorded predetermined/predeterminable or previously calculated or defined number of set-up families. An objective function is calculated using integer linear programming. The sum of the numbers of component types per set-up family is minimized with this objective function. If the example in FIG. 2 is considered, the second circuit board 210 is not assigned to the same set-up family as the circuit board 205, but instead to the same set-up family as the circuit board 215. As a result, the quantity 235 has one component type and the quantity 240 combined with the quantity 245 has five component types. The sum of the numbers (one plus five) of component types per set-up family is six here and not ten (five plus five) if the second circuit board 210 were assigned to the same set-up family as the circuit board 205. This means that fewer set-up stations are required, since a redundant set-up of components of the same component type is avoided on the whole.

Additional restrictions can be taken into account with the method according to embodiments of the invention:

- Component-table restrictions apply on the pick-and-place line, i.e., components must not be set up on all tables, but only on a sub-quantity of tables 140, 145.
- The maximum degree of filling of a feed device can be maintained.
- Circuit boards of a first sub-quantity of the circuit boards to be assigned must be distributed into the same cluster (e.g., the upper and lower side of a circuit board).
- Circuit boards of a second sub-quantity of the circuit boards must not be assigned to the same cluster, but must be assigned to a different cluster.

Mathematical Background

By using exact mathematical methods, significantly better solutions can be achieved than with heuristics previously used in practice.

In the MILP formulation described below, the following terms apply:

Indices

| | |
|---|---|
| R | Quantity of circuit boards 120 |
| C | Quantity of component types 155 |
| F | Quantity of set-up families 250, 255 with predetermined number |
| $R_c$ | Quantity of circuit boards with component type c |

A method is known from EP 2 829 166 B1 for forming set-up families on pick-and-place lines. A method is described herein with which, for a given pick-and-place line and quantity of circuit boards, a quantity of set-up families with a minimum number can be defined and thus predetermined for the above F. However, other methods or manual input are also conceivable which can predetermine the minimum number. Any other number can also be predetermined.

Parameters

| | |
|---|---|
| $CapUsage_c$ | Trace usage of component c |
| $Cap_f$ | Number of available traces in the set-up of set-up family f |

Binary Variables

| | |
|---|---|
| $x_{r,f}$ | Assignment of circuit board r to set-up family f |
| $y_{c,f}$ | Use of a component c in set-up family f |

IP Formulation

Minimize $\Sigma_{f \in F} \Sigma_{c \in C} y_{c,f}$

Secondary Conditions:

(1) Each circuit board type must be assigned to precisely one set-up family:

$\Sigma_{f \in F} x_{r,f} = 1, r \in R$ (2) If a circuit board is assigned to one set-up family, all component types of this circuit board must also be included in the set-up of this set-up family:

$x_{r,f} \leq y_{c,f}, c \in C, f \in F, r \in R_c$ (3) All component types of the circuit boards of a set-up family must fit into a set-up with their trace usage:

$\Sigma_{c \in C} CapUsage_c \cdot y_{c,f} \leq Cap_f, f \in F$ (4) Variable Restrictions:

$y_{c,f} \in \{0,1\}, c \in C, f \in F$ $x_{r,f} \in \{0,1\}, r \in R, f \in F$

Although embodiments of the invention have been illustrated and described in more detail by the example embodiment, the invention is not restricted by the examples disclosed and other variations can be derived therefrom by the person skilled in the art without departing the scope of embodiments of the invention.

The processes or method sequences described above can be implemented using instructions that are available on computer-readable storage media or in volatile computer memories (hereinafter referred to collectively as computer-readable memories). Computer-readable memories are, for example, volatile memories such as caches, buffers or RAM as well as non-volatile memories such as removable data carriers, hard disks, etc.

The functions or steps described above can be present in the form of at least one set of instructions in/on a computer-readable memory. The functions or steps are not tied to a specific instruction set or to a specific form of instruction set or to a specific storage medium or to a specific processor or to specific execution schemes and can be implemented through software, firmware, microcode, hardware, processors, integrated circuits, etc., in standalone operation or in any combination. A wide variety of processing strategies can be used, for example serial processing by a single processor or multiprocessing or multitasking or parallel processing, etc.

The instructions can be stored in local memories, but it is also possible to store the instructions on a remote system and access them via a network.

In connection with embodiments of the invention, "computer-aided" can mean, for example, an implementation of the method in which, in particular, a processor executes at least one method step of the method. A control device described above can have such a processor.

The term "processor", "central signal processing", "control unit" or "data evaluation means or data evaluator", as used here, includes processing means or a processor in the broadest sense, i.e., for example, servers, universal processors, graphics processors, digital signal processors, application-specific integrated circuits (ASICs), programmable logic circuits such as FPGAs, discrete analog or digital circuits and any combinations thereof, including any other processing means or processor known to the person skilled in the art or developed in the future. Processors can consist of one or more apparatuses or devices or units. If a processor consists of a plurality of apparatuses, these can be designed or configured for parallel or sequential processing or execution of instructions. In connection with embodiments of the invention, a "memory unit" can be understood to mean, for example, a memory in the form of a random access memory (RAM) or a hard disk.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A method for determining set-up families for a pick-and-place line for populating circuit boards with electronic components of one or more component types, wherein the method comprises:

detecting a predetermined or predeterminable number of set-up families, wherein a set-up family is defined as a quantity of circuit boards that can be populated on a pick-and-place line without changing the quantity of component types that are kept ready for population on the pick-and-place line;
wherein
an assignment of circuit boards to be distributed to the detected number of set-up families is optimized by integer linear programming in such a way that the sum of the numbers of component types per set-up family is minimized, and
populating the circuit boards in the set-up family assigned to them.

2. The method as claimed in claim 1, wherein the detected number of set-up families represents a minimum number of set-up families.

3. The method as claimed in claim 1, wherein the assignment of circuit boards to be distributed to the detected number of set-up families also takes place in such a way that the circuit boards of a first sub-quantity of the circuit boards to be distributed are assigned to the same set-up family.

4. The method as claimed in claim 3, wherein the circuit boards to be distributed to the detected number of set-up families are assigned in such a way that the circuit boards of a second sub-quantity of the circuit boards to be distributed are assigned in each case to a different set-up family.

5. A computer program product, comprising a computer readable hardware storage device having computer readable program code stored therein, said program code executable by a processor of a computer system to implement the method as claimed in claim 1.

6. A control device for determining set-up families for a pick-and-place line for populating circuit boards with electronic components of one or more component types, comprising:
means for detecting or a detector for a predetermined or predeterminable number of set-up families,
wherein a set-up family is defined as a quantity of circuit boards that can be populated on a pick-and-place line without changing the quantity of component types that are kept ready for population on the pick-and-place line;
wherein
means for assigning or an assignor for circuit boards to be distributed to the recorded number of set-up families which are configured to optimize this assignment by integer linear programming in such a way that the sum of the number of component types per set-up family is minimized, and
means for populating or a populator of the circuit boards in the set-up family assigned to them.

7. A method for determining set-up families for a pick-and-place line for populating circuit boards with electronic components of one or more component types, wherein the method comprises:
detecting a predetermined or predeterminable number of set-up families,
wherein a set-up family is defined as a quantity of circuit boards that can be populated on a pick-and-place line without changing the quantity of component types that are kept ready for population on the pick-and-place line;
wherein an assignment of circuit boards to be distributed to the detected number of set-up families is optimized by integer linear programming in such a way that the sum of the numbers of component types per set-up family is minimized, and
populating the circuit boards in the set-up family assigned to them;
wherein a maximum threshold value in the form of a maximum degree of filling is predetermined for the quantity of component types that are kept ready on the pick-and-place line for the population.

8. The method as claimed in claim 7, wherein the detected number of set-up families represents a minimum number of set-up families.

9. The method as claimed in claim 7, wherein the assignment of circuit boards to be distributed to the detected number of set-up families also takes place in such a way that the circuit boards of a first sub-quantity of the circuit boards to be distributed are assigned to the same set-up family.

10. The method as claimed in claim 9, wherein the circuit boards to be distributed to the detected number of set-up families are assigned in such a way that the circuit boards of a second sub-quantity of the circuit boards to be distributed are assigned in each case to a different set-up family.

11. A computer program product, comprising a computer readable hardware storage device having computer readable program code stored therein, said program code executable by a processor of a computer system to implement the method as claimed in claim 7.

* * * * *